United States Patent
Ramsay et al.

(10) Patent No.: US 12,415,158 B2
(45) Date of Patent: Sep. 16, 2025

(54) APPARATUS AND METHOD FOR ELECTRON IRRADIATION SCRUBBING

(71) Applicant: DAPHNE TECHNOLOGY SA, Saint-Sulpice (CH)

(72) Inventors: William Jamieson Ramsay, Saint-Sulpice (CH); Juan Mario Michan, Saint-Sulpice (CH); Henrik Westermark, Saint-Sulpice (CH)

(73) Assignee: DAPHNE TECHNOLOGY SA, Saint-Sulpice (CH)

( * ) Notice: Subject to any disclaimer, the term of this patent is extended or adjusted under 35 U.S.C. 154(b) by 388 days.

(21) Appl. No.: 18/014,391

(22) PCT Filed: Jul. 6, 2021

(86) PCT No.: PCT/EP2021/068663
§ 371 (c)(1),
(2) Date: Jan. 4, 2023

(87) PCT Pub. No.: WO2022/008511
PCT Pub. Date: Jan. 13, 2022

(65) Prior Publication Data
US 2023/0258113 A1  Aug. 17, 2023

(30) Foreign Application Priority Data
Jul. 7, 2020  (GB) .................................. 2010415

(51) Int. Cl.
*B01D 53/32*  (2006.01)
*B01D 53/92*  (2006.01)
(Continued)

(52) U.S. Cl.
CPC .......... *B01D 53/323* (2013.01); *B01D 53/92* (2013.01); *F01N 3/0892* (2013.01);
(Continued)

(58) Field of Classification Search
None
See application file for complete search history.

(56) References Cited

U.S. PATENT DOCUMENTS 5,260,043 A   11/1993  Li et al.
5,451,385 A    9/1995  Hansel et al.
(Continued)

FOREIGN PATENT DOCUMENTS

CA   2534031 A1    4/2006
CN   203507791 U   4/2014
(Continued)

OTHER PUBLICATIONS

KR20150078105A_ENG (Espacenet machine translation of Kim) (Year: 2015).*
(Continued)

*Primary Examiner* — Gabriel E Gitman
(74) *Attorney, Agent, or Firm* — Myers Bigel, P.A.

(57) ABSTRACT

There is provided a dielectric barrier electrical discharge apparatus, system and method. The apparatus comprises at least two electrodes arranged in use to provide at least one anode and at least one cathode an electric field thereby being establishable therebetween, the at least two electrodes being separated to allow a fluid to be present between the electrodes in use. At least one of the electrodes has a dielectric portion connected to at least part of said electrode, and a sub-macroscopic structure is connected to at least one of the electrodes or dielectric portion.

16 Claims, 7 Drawing Sheets

(51) Int. Cl.
*F01N 3/08* (2006.01)
*H01J 37/32* (2006.01)

(52) U.S. Cl.
CPC ........... *B01D 2257/7025* (2013.01); *B01D 2258/018* (2013.01); *B01D 2259/4566* (2013.01); *B01D 2259/812* (2013.01); *B01D 2259/818* (2013.01); *H01J 37/32348* (2013.01); *H01J 37/32844* (2013.01); *Y02C 20/20* (2013.01)

(56) References Cited

U.S. PATENT DOCUMENTS

| | | | |
|---|---|---|---|
| 5,955,046 A | 9/1999 | Okimura et al. | |
| 6,119,455 A | 9/2000 | Hammer et al. | |
| 10,422,260 B2 * | 9/2019 | Tonsich | B01D 53/685 |
| 11,123,689 B2 * | 9/2021 | Michan | B01D 53/92 |
| 2004/0072687 A1 | 4/2004 | Sekiba et al. | |
| 2004/0237509 A1 | 12/2004 | Bhargava et al. | |
| 2009/0018668 A1 * | 1/2009 | Galbraith | B01D 53/02 |
| | | | 210/175 |
| 2012/0097027 A1 | 4/2012 | Gunther | |
| 2013/0086893 A1 | 4/2013 | Shinoda et al. | |
| 2014/0069086 A1 | 3/2014 | Lapointe et al. | |
| 2016/0003117 A1 | 1/2016 | Cook | |
| 2016/0192501 A1 * | 6/2016 | Yan | H10D 64/205 |
| | | | 29/846 |
| 2017/0018409 A1 | 1/2017 | Akita et al. | |
| 2017/0298799 A1 | 10/2017 | Narayanaswamy et al. | |
| 2017/0298800 A1 | 10/2017 | Idicheria et al. | |
| 2018/0238216 A1 | 8/2018 | Han et al. | |
| 2019/0054418 A1 | 2/2019 | Michan | |
| 2019/0168159 A1 | 6/2019 | Poojary et al. | |
| 2020/0346476 A1 * | 11/2020 | Hart | B41M 1/00 |
| 2021/0213531 A1 * | 7/2021 | Meshkat Mamalek | |
| | | | B22F 1/0547 |

FOREIGN PATENT DOCUMENTS

| | | | |
|---|---|---|---|
| CN | 104307361 A | 1/2015 | |
| CN | 105642080 A | 6/2016 | |
| CN | 205435413 U | 8/2016 | |
| CN | 105944524 A | 9/2016 | |
| CN | 106268222 A | 1/2017 | |
| CN | 104383812 B | 3/2017 | |
| CN | 104941400 B | 3/2017 | |
| CN | 107281908 A | 10/2017 | |
| CN | 107587917 A | 1/2018 | |
| CN | 108083395 A | 5/2018 | |
| CN | 108435190 A | 8/2018 | |
| DE | 102014226652 A1 | 6/2016 | |
| EP | 0468556 A1 | 1/1992 | |
| EP | 1708242 A1 | 10/2006 | |
| EP | 1712752 A2 | 10/2006 | |
| EP | 1920815 A2 | 5/2008 | |
| EP | 2019464 A1 | 1/2009 | |
| EP | 2325449 A1 | 5/2011 | |
| EP | 3061515 A1 | 8/2016 | |
| GB | 2537196 A | 10/2016 | |
| JP | H05113202 A | 5/1993 | |
| JP | H06126173 A | 5/1994 | |
| JP | H07108136 A | 4/1995 | |
| JP | H08332392 A | 12/1996 | |
| JP | H0970540 A | 3/1997 | |
| JP | H10277355 A | 10/1998 | |
| JP | H10309462 A | 11/1998 | |
| JP | 2000107602 A | 4/2000 | |
| JP | 2000117057 A | 4/2000 | |
| JP | 2000279758 A | 10/2000 | |
| JP | 2000279766 A | 10/2000 | |
| JP | 2000282844 A | 10/2000 | |
| JP | 2000282854 A | 10/2000 | |
| JP | 2001137705 A | 5/2001 | |
| JP | 2001190931 A | 7/2001 | |
| JP | 2001205109 A | 7/2001 | |
| JP | 2001227330 A | 8/2001 | |
| JP | 2001340758 A | 12/2001 | |
| JP | 2002061541 A | 2/2002 | |
| JP | 2002122033 A | 4/2002 | |
| JP | 2002159854 A | 6/2002 | |
| JP | 2002331236 A | 11/2002 | |
| JP | 2002349254 A | 12/2002 | |
| JP | 2005207316 A | 8/2005 | |
| JP | 2006125269 A | 5/2006 | |
| JP | 2006278236 A | 10/2006 | |
| JP | 2007021384 A | 2/2007 | |
| JP | 2007220488 A | 8/2007 | |
| JP | 2008516380 A | 5/2008 | |
| JP | 2008168284 A | 7/2008 | |
| JP | 2010194448 A | 9/2010 | |
| JP | 2011218293 A | 11/2011 | |
| JP | 2012180765 A | 9/2012 | |
| JP | 2013078759 A | 5/2013 | |
| JP | 5299647 B2 | 6/2013 | |
| JP | 2014091119 A | 5/2014 | |
| JP | 2014172022 A | 9/2014 | |
| JP | 2015010602 A | 1/2015 | |
| JP | 2015196109 A | 11/2015 | |
| JP | 2016076350 A | 5/2016 | |
| JP | 2016150296 A | 8/2016 | |
| JP | 2016215091 A | 12/2016 | |
| JP | 2017002867 A | 1/2017 | |
| JP | 2017087197 A | 5/2017 | |
| JP | 2019501022 A | 1/2019 | |
| JP | 2019122908 A | 7/2019 | |
| JP | 2019155242 A | 9/2019 | |
| JP | 2019155258 A | 9/2019 | |
| KR | 20030056065 A | 7/2003 | |
| KR | 20060055141 A | 5/2006 | |
| KR | 20130023514 A | 3/2013 | |
| KR | 20150078105 A * | 7/2015 | ............ B01D 53/32 |
| KR | 102047081 B1 | 11/2019 | |
| WO | 9926726 A1 | 6/1999 | |
| WO | 03055585 A1 | 7/2003 | |
| WO | 03080234 A1 | 10/2003 | |
| WO | 2004009220 A1 | 1/2004 | |
| WO | 2009057959 A2 | 5/2009 | |
| WO | 2010147071 A1 | 12/2010 | |
| WO | 2014136063 A2 | 9/2014 | |
| WO | 2014191060 A1 | 12/2014 | |
| WO | 2015037536 A1 | 3/2015 | |
| WO | 2015095026 A1 | 6/2015 | |
| WO | 2015095038 A1 | 6/2015 | |
| WO | 2016008054 A1 | 1/2016 | |
| WO | 2016035953 A1 | 3/2016 | |
| WO | 2016139283 A1 | 9/2016 | |
| WO | 2017211280 A1 | 12/2017 | |
| WO | 2017217833 A1 | 12/2017 | |
| WO | 2018041632 A1 | 3/2018 | |
| WO | 2018073563 A1 | 4/2018 | |
| WO | 2018154872 A1 | 8/2018 | |
| WO | 2019039513 A1 | 2/2019 | |
| WO | 2019045430 A1 | 3/2019 | |
| WO | 2020121287 A1 | 6/2020 | |

OTHER PUBLICATIONS

Japanese Office Action corresponding to JP 2023-501324; mailed Feb. 12, 2025 (English machine translation included), 14 pp.
Japanese Search Report corresponding to JP 2023-501324; mailed Jan. 24, 2025 (English machine translation included), 82 pp.
"International Search Report and Written Opinion of the International Searching Authority", International Application No. PCT/EP2021/068663, Oct. 26, 2021, 19 pp.
"Patents Act 1977: Combined Search and Examination Report under Sections 17 and 18(3)", Application No. GB2010415.4, Sep. 7, 2020, 8 pp.
Le Fevre, Chris N., "A review of demand prospects for LNG as a marine transport fuel", The Oxford Institute for Energy Studies, Jun. 2018, 35 pp.

(56) References Cited

OTHER PUBLICATIONS

Pavlenko, Nikita, et al., "The climate implications of using LNG as a marine fuel", Working Paper, International Council on Clean Transportation, Jan. 2020, 40 pp.

Stenersen, Dag, et al., "GHG and NOx emissions from gas fuelled engines", Report, SINTEF Ocean As, OC2017 F-108—Unrestricted, Jun. 13, 2017, 52 pp.

Winnes, Hulda, et al., "Aftertreatment of methane slip from marine gas engines", Lighthouse Swedish Maritime Competence Centre, Sweden, 2020, 48 pp.

Worth, Donnie J., et al., "Characterization and Evaluation of Methane Oxidation Catalysts for Dual-Fuel Diesel and Natural Gas Engines", Emission Control Science and Technology, vol. 2, Issue 4, Oct. 2016, pp. 204-214.

* cited by examiner

APPARATUS AND METHOD FOR ELECTRON IRRADIATION SCRUBBING

RELATED APPLICATIONS

This application is a 35 U.S.C. § 371 national phase application of International Application Serial No. PCT/EP2021/068663, filed Jul. 6, 2021, which claims the benefit of and priority to Great Britain Patent Application Serial No. 2010415.4, filed Jul. 7, 2020, which are each incorporated herein by reference in their entirety.

FIELD OF THE INVENTION

The present disclosure relates to methods of scrubbing of gas by exposure to electrons and electrical discharge and apparatuses therefor. Typically, this is achieved through use of a sub-macroscale structure and a dielectric material.

BACKGROUND

As a result of increasing global concern regarding pollutant emissions from the use of fossil fuels and other processes, which contribute to poor air quality, environmental damage, and harm to human health, there is an increased focus on air quality and emissions regulations. There is therefore a need to provide means to eliminate or reduce the concentration of pollutant emissions into the atmosphere.

Hydrocarbons represent one pollutant where it is desirable to minimize or eliminate release into the atmosphere. In particular, there is a desire to minimize methane (CH4, $CH_4$) emissions because methane is a potent greenhouse gas and, as such, is of concern due to its contribution to rising global temperatures. Methane has a shorter atmospheric lifetime than carbon dioxide (CO2, $CO_2$) over the established periods presented by the Intergovernmental Panel on Climate Change (IPCC), which are 20 years, 100 years and 500 years, and the importance of methane is relatively high in a shorter time frame (IPCC 2013).

In recent years, liquefied natural gas (LNG), which has methane as its main component, has attracted attention as an alternative fuel to petroleum and light oil, and has been used as a fuel to power engines, for example, on ships. From an air quality perspective, LNG fuel has many advantages compared to traditional (marine) fuels. The emissions of sulphur dioxide (SO2, $SO_2$) are low due to low or non-existing sulphur content of the gas. The low sulphur content and the absence of fuel aromatics also contributes to low particulate formation levels. Further, the most widely used marine LNG engines have significantly less emissions of nitrogen oxides (NOx, $NO_x$) than the traditional marine diesel engines.

Although LNG engines are expected to be a relatively clean alternative fuel that can realize low-pollution, many LNG engines that are produced today have problems with unburned methane passing through the engine and being emitted with the exhaust gases. This so-called "methane slip" has been estimated at around 2.3% to 4.1% for the engines that are in operation today (Stenersen and Thonstad, 2017). The quantity of this slip has caused LNG to be comparable to or worse than marine gas oil (MGO) for greenhouse gas emissions, measured as $CO_2$-equivalents (Pavlenko et al., 2020; Winnes et al., 2020).

The use of LNG as a marine fuel has increased significantly over the last two decades. In 2010, 1.4% of the delivered ships were built for LNG-propulsion. This share increased to 5.7% in 2017 and further to 13.5% by 2018 (Le Fevre, 2018). Factors that have influenced this development were, and are, regionally stricter rules for ship emissions of sulphur and nitrogen oxides, and a relatively low price for LNG compared to MGO.

Due to the detrimental impact of unburned methane from LNG engines on the environment, climate and human health, and in consideration of its increased use in the last decade, it is desirable to purify exhaust gas, removing methane before it is released into the atmosphere.

There is on-going development at engine manufacturers to reduce the methane slip from LNG engines, and although the work has been moderately successful since the problem was first observed, there appears to be a limit for slip reduction by engine design measures (Pavlenko et al, 2020). Thus, other post-engine methods are needed to eliminate methane slip.

Typically, hydrocarbons (including methane) are removed using catalysts such as platinum, palladium, or rhodium at high temperatures or by adsorption methods. Methane is a relatively stable molecule and so traditionally requires temperatures of at least 400 degrees Celsius (° C.) over a precious metal-based catalyst to oxidise.

The paper "Characterisation and Evaluation of Methane Oxidation Catalysts for Dual-Fuel Diesel and Natural Gas Engines", Emission Control Science and Technology (2016) 2, p 204-214, discloses low temperature removal of methane from exhaust gases at temperatures under 400° C. using catalysts with high loadings of platinum and palladium (up to 340 grams per cubic foot, $g/ft^3$, 12,000 grams per cubic metre, $g/m^3$).

There remains a need for methane slip removal processes that does not require precious metal-based catalyst materials.

A catalyst-free scrubber technology used for treatment of flue emissions from fossil fuel burning facilities (such as power stations) and from municipal solid waste burning incinerators is electron beam flue gas treatment (EBFGT). EBFGT removes sulphur oxides (SOx, $SO_x$) and $NO_x$ from stack gases (i.e. gases passing through an exhaust stack) at low energy cost by conversion with ammonia (NH3, $NH_3$) to non-noxious ammonium sulphate-nitrate, usable as an agricultural fertilizer. This technique involves humidified flue gases passing through an electron beam reactor where high-energy electrons bombard nitrogen, water and oxygen to create strong reagents that react with the sulphur oxides and nitrogen oxides to form sulphuric and nitric acids.

In EBFGT, the electron beam reactor is formed by a bank of electron beam accelerators, specifically double-grid tetrode electrode guns in which the cathode housing is located in a vacuum housing. Free electrons are produced in an ultra-clean environment (referred to as ultra-high vacuum) where the pressure is around 12 orders of magnitude lower than atmospheric pressure. The electrons are then accelerated and sent through an aluminium or titanium membrane that separates the ultra-high vacuum environment from the flue stack were the pollutant gases are flowing. The electrons that get through the aluminium membrane collide with the gas molecules and start a chemical chain reaction that removes the pollutants.

However, only a very low proportion of the electrons are emitted from the metal membrane compared to the number incident on the membrane. This makes the process inefficient due to energy being wasted by the energy being converted to heat in the membrane. In addition, implementations of such EBFGT systems require very large capital costs due to the electron accelerator installation. The electron accelerators also require frequent maintenance and extreme safety requirements, which is undesirable or not possible in the location in which the reactor is installed. Further, multiple accelerators must be implemented for redundancy purposes.

The need for an ultra-high vacuum adds expense and can contribute to accelerator failures. Additionally, using this technology for mobile applications is undesirable because the radiation shielding needed to protect against at least X-ray emission and ionization radiation is heavy.

In view of the above circumstances, a practical means for exhaust gas purification apparatus capable of favourably oxidizing unburned components (such as methane) of a gas fuel (such as LNG) is needed.

SUMMARY OF INVENTION

According to a first aspect, there is provided electrical discharge for use in scrubbing methane from a gas. The high-energy electrons generated during the discharge have been found to scrub methane from gases containing methane. Since electrical discharge can be provided without the need for a vacuum or an electron beam, and we have found this allows the amount of methane in a gas to be reducible, this provides a simplified process by which methane is able to be removed from a gas over known techniques. The scrubbing reduces the amount of methane present in the gas after having been processed.

By the term "electrical discharge", we intend to mean release and transmission of electricity in an applied electric field through a medium such as a gas. A flow of electrons in the form of a filament passing from one location to another or between two points typically achieves this. The flow of electrons is typically a transient flow of electrons in the form of a filament. By this we intend to mean that the flow of electrons in a microdischarge/filament during electrical discharge lasts for only a short time per individual discharge event. There may of course be many of filaments over time. In contrast, in field-emission, the flow of electrons is approximately constant once a threshold voltage is reached to allow the field-emission to occur. The electrical discharge allows the electrical discharge to such provide transmission of electricity in an applied electric field through gas.

Any form of electrical discharge may be suitable for scrubbing methane from a gas, such as pulse, corona, electron beam, radio frequency, microwave or ultraviolet light radiation electrical discharge. Typically however, the electrical discharge may be barrier electrical discharge. We have found that barrier electrical discharge is able to be used to reduce methane content in gas, and thereby allowing it to be used to reduce methane slip from exhaust gases. The presence of the dielectric does not allow arcs or sparks to occur (i.e. discharge that generates sustained current between the electrodes). Instead it only allows microdischarges to occur, which typically only last for microseconds. This provides the necessary energy and components to contribute the chemical reaction pathway by which methane is able to be broken down, while limiting the amount of power needed to provide sustained discharge Typically, the electrical discharge is dielectric barrier electrical discharge. In using dielectric barrier electrical discharge the discharge is more controllable since less sparking occurs, meaning there is less wear and damage caused by the discharge.

The gas may be a waste gas. Additionally or alternatively the gas may be a gas from an LNG engine. This allows the electrical discharge to be used to reduce methane slip in exhaust gases, such as flue emissions, from combustion engines, for example in ships and other vehicles, power plants and incinerators.

According to a second aspect, there is provided barrier electrical discharge for use in scrubbing methane in waste gases.

According to a third aspect, there is provided dielectric barrier electrical discharge for use in scrubbing methane in waste gases.

According to a fourth aspect, there is provided use of electrical discharge in scrubbing methane from a gas.

Typically, the electrical discharge may be barrier electrical discharge. For example, the electrical discharge may be dielectric barrier electrical discharge.

The gas may be a waste gas. Additionally or alternatively, the gas may be a gas from an LNG engine.

According to a fifth aspect, there is provided use of barrier electrical discharge in scrubbing methane from a gas.

According to a sixth aspect, there is provided use of dielectric barrier electrical discharge in scrubbing methane from a gas.

According to a seventh aspect, there is provided a dielectric barrier electrical discharge apparatus, comprising: at least two electrodes arranged in use to provide at least one anode and at least one cathode an electric field thereby being establishable therebetween, the at least two electrodes being separated to allow a fluid to be present between the electrodes in use, wherein at least one of the electrodes has a dielectric portion connected to at least part of said electrode, and a sub-macroscopic structure being connected to at least one of the electrodes or dielectric portion.

Application of a sub-macroscopic structure to the electrodes or dielectric portion is a technically difficult process due to the need to maintain order within the structure and the difficulty in attaching the structure to the surface of the electrode or dielectric portion. Additionally, using a sub-macroscopic structure implements a "plate to point" structure causing a disparity in the homogeneity of the electric field strength since the field strength at an end of the structure is higher than on (for example) an electrode that typically has a larger area over which the field is spread. However, we have found that using a sub-macroscopic structure in a dielectric barrier electrical discharge apparatus allows less power to be used. This is because, in use, when an electric field is established between an anode and a cathode the structure field emits electrons. The field emission causes the gap between anode and cathode to have a raised density of electrons. This saves power as more electrons are present to initiate chemical reactions. This is achieved by combining the classical electrostatic phenomenon of electrical discharge with the quantum phenomenon of tunnelling in the form of field emission when typically, classical and quantum processes are kept separate from each other when used in physical applications.

By the structure being connected to at least one of the electrodes or dielectric portion, we intend to mean that at least one structure is connected to at least one electrode or dielectric. This means that more than one electrode and/or the dielectric portion may have one or more structures connected thereto. There may of course be a plurality of structures, each structure being connected to one of an electrode or the dielectric portion, such as all the structures being connected to a only single electrode or only the dielectric portion, or one or more electrodes and/or the dielectric portion having one or more structures connected thereto. It is intended that when a structure is connected to an electrode or the dielectric portion, that structure is only connected to that respective electrode or the dielectric portion, and not also connected to an or another electrode or the dielectric portion (when connected to an electrode).

The fluid is typically a gas, but may be another type of fluid, such as a liquid.

The structure can be any sub-macroscopic structure, such as a mesoscopic structure. Typically, the structure may be a nanostructure.

The nanostructure could be a carbon, silicon, titanium oxide or manganese oxide nanowire, nanotube or nanohorn, or stainless steel, aluminium or titanium microneedles. The nanostructure may typically be a carbon nanotube (CNT). CNTs have been found to be very good field-emitters of electrons when exposed to an electric field. CNTs and other materials can produce large numbers of electrons at relatively low applied voltages because of their very high aspect ratio (typically 50 to 200 nanometres, nm, diameter versus 1 to 2 millimetres, mm, in length, i.e. 5,000 to 40,000 aspect ratio) and their low work function (typically around 4 electron volts, eV). The high aspect ratio causes a large field enhancement at the tips of the CNTs with several volts per micrometre, also referred to as a micron, (V/μm) achievable at low applied voltages. The minimum electric field strength required for field-emission from a CNT is generally around 30 V/μm. This can be achieved by varying one or more of the length of the CNT, the diameter of the CNT, the distance between the electrodes used to create the electric field, and the applied voltage used to establish the electric field. If an array of CNTs is used, the density of the array can also be varied to vary the electric field strength since CNTs tend to shield one another.

The nanostructure could be a multi-walled CNT (MWNT) or a metallic single walled CNT (metallic SWNT).

The structure may be electrically connected to at least one of the electrodes. Additionally or alternatively, the or each electrode to which the or each structure is electrically connected may be arranged in use to provide a cathode.

According to an eighth aspect, there is provided an apparatus (suitable) for scrubbing methane in waste gases, the apparatus comprising: a first electrode and a second electrode, the first and second electrodes being arranged in use to provide an anode and a cathode; a dielectric portion connected to the first electrode and a sub-macroscopic structure connected to the first or second electrode or to the dielectric portion, wherein, in response to the presence of an electric field between the electrodes, the structure is arranged to field-emit electrons and electrical discharge is establishable between the dielectric and the second electrode; and a housing coupled to the electrodes, the electrodes being located on the housing so that the structure and the dielectric portion each extend into a container containing gas to be scrubbed such that an interior of said container can be exposed to said electrons and electrical discharge.

The use of the dielectric portion and the structure provide a synergistic effect of lowering the power and voltage needed to establish electrical discharge while allowing methane to be removed from gas. Additionally, using the dielectric portion allows the discharge to be more controllable by reducing the amount of sparking and thereby the amount of wear and damage caused by electrical discharge. If the structure was used without the dielectric portion, the larger amount of sparking would limit the usefulness of the structure since this is typically more susceptible to damage form sparking than other parts of the apparatus. Conversely, if the dielectric were used without the structure, the density of electrons to initiate methane breakdown would be lower and thus require higher energies to achieve the same reduction efficiency. As such, the combined effect of using the dielectric and the structure has a greater benefit than the benefits offered of using each independently.

It is intended that the housing may be arranged to scrub methane from a gas. This is achieved by the electrodes being located on the housing so that the structure and the dielectric portion each extend into the container.

The first electrode may be arranged in use to provide the anode (or an anode if there is more than one anode, such as when there are more than two electrodes). Additionally or alternatively, the second electrode may be arranged in use to provide the cathode (or a cathode if there is more than one cathode, such as when there are more than two electrodes).

The structure may be electrically connected to one of the electrodes. Typically, the structure is electrically connected to the second electrode.

The electrodes may be any suitable material for providing electrodes that allow an electrical field to be established therebetween. Typically, the electrodes may be made of an electrically conductive metal.

The dielectric portion being connected to the first electrode and the structure being connected to the second electrode allows application of the dielectric portion and structure to the respective electrodes to be independent. This avoids the possibility of the processes for applying the dielectric portion to the electrode and for applying the structure to the electrode damaging the structure or dielectric respectively. Accordingly, this simplifies the process of manufacturing the apparatus and reduces the failure rate in manufacture.

The following features may be applicable to the seventh or the eighth aspect.

The dielectric portion may provide a form of covering of at least part of the or each electrode to which it is connected. Typically, the dielectric portion is a coating on at least part of a surface of the or each electrode to which the dielectric portion is connected. For example, the dielectric portion may coat the entire surface of the or each electrode to which it is connected.

The dielectric portion may have a thickness of between about 0.1 mm and 10 mm, such as about 2 mm.

By the dielectric portion being connected to at least one electrode, we intend to mean that each electrode to which the dielectric portion is connected is connected to a dielectric portion independently of each other dielectric portion and electrode. This means there may be a plurality of dielectric portions. Each dielectric portion may be connected to only a single electrode.

The dielectric portion may be one or more of mica, quartz, alumina, titania, barium titanate, fused silica, titania silicate, silicon nitride, hafnium oxide or a ceramic. By the phrase "one or more of" in this case we intend to mean a combination of two or more of the named materials when two or more of these are used.

Typically, the dielectric portion is quartz. This is because quartz as this material is readily available, low cost, can be processed in large quantities and can have a high resistance to thermal stress. The dielectric portion may alternatively be mica. Mica is beneficial because it has a slightly higher dielectric constant than other dielectric materials, such as glass.

As set out above, the sub-macroscopic structure may be any form of suitably sized structure. Typically, the structure may be a nanostructure.

The nanostructure may have an aspect ratio of length to width of at least 1,000 (i.e. 1,000 to 1). A nanostructure with an aspect ratio of at least 1,000 provides more efficient field emission than those with a lower aspect ratio. The aspect ratio may be at least 5,000 or at least 10,000. Increasing the aspect ratio has been found to further increase the efficiency of the field emission.

As an alternative to a nanostructure, the structure may be a microstructure. Typically, the microstructure may have an aspect ratio of length to width of at least 5 (i.e. 5 to 1), such as an aspect ratio or at least 8, 9 or 10. Microstructures typically do not field-emit as efficiently as nanostructures, such as CNTs. However, using microstructures, such as nanowires, simplifies manufacture of the apparatus since large arrays of vertically aligned microstructures can be easily manufactured on an industrial scale.

The apparatus may further comprise a substrate on which each structure is formed or is located. The substrate may be electrically conductive.

The substrate may be comprised in or electrically connected to the cathode.

The substrate may comprise one or both of silicon and a metal. The silicon may be highly doped conductive silicon. The silicon may be coated with aluminium at least on a side on which said structure is formed or located. The metal may comprise titanium, and/or a titanium alloy, and/or aluminium, and/or an aluminium alloy and/or copper, and/or a copper alloy. The metal may be polished.

The structure may be coated with one or more low work function materials, such as up to 4 eV. This improves the field emission of the structure. Alternatively, or additionally, the structure may be doped with electron transport enhancing or electrical conductivity enhancing materials. This makes the field emission more efficient. For example, Group III (acceptor) or Group V (donor) atoms (e.g. phosphorous or boron) could be used in silicon nanostructures.

The structure may be at least partially coated in a material having a work function of up to or less than 4 eV. Said material may be caesium or hafnium.

The coating material may have a melting point of at least 400° C.

The structure may be at least partially coated in a catalytic coating. Said catalytic coating may be one or more of vanadium oxide, zinc oxide, titanium dioxide and tungsten trioxide. Said catalytic coating may be applied over a stabilizing coating, such as titanium dioxide.

The structure may be an array of (individual) sub-macroscopic structures. The array may comprise a combination of at least two of: one or more uncoated structures, one or more structures at least partially coated in a material having a work function of less than 4 eV, and one or more structures at least partially coated in a catalytic coating.

The structure may be hollow. When the structure is hollow, the interior of the structure may be at least partially filled with a stiffening material. The stiffening material may include a transition metal such as titanium, iron or copper. The stiffening material may include a material of the substrate on which the structure may be formed. The substrate may comprise titanium. The stiffening material may comprise titanium carbide.

The structure may be doped with an electron transport enhancing or electrical conductivity enhancing material.

In some examples the electrodes are arranged in use to be between 20° C. and 500° C. In other examples, the electrodes are arranged in use to be between 100° C. and 400° C., such as at 150° C. These temperatures allow the apparatus to operate optimally. A temperature of 150° C. is typically considered as the temperature at which the chemical pathway for breaking down methane is optimised while minimising material breakdown of the components of the apparatus at the same time.

If titanium dioxide is used, either to form the structures or to coat the structure, the temperature of the structures (for whatever reasons, such as due to deliberate heating for self-repair or as a result of exposure to hot exhaust gas) should be kept below 600° C. This is because above this temperature, titanium dioxide changes from an anatase structure to a rutile structure, which is undesirable.

The apparatus may further comprise a power supply connected to at least one of the electrodes, the power supply being arranged in use to provide a voltage pulse to said at least one electrode. The voltage pulse increases the ionisation of gas between the electrodes thereby speeding up the process of removing methane from the gas.

The power supply may be arranged in use to provide a voltage pulse having at least one of the following: a duration between 1 nanosecond (ns) and 1 millisecond (ms); and a repeat periodicity of between 100 Hertz (Hz) and 500 kHz, the pulse repetition preferably forming a pulse train with a duty cycle of less than 50%.

Optimal pulse parameters may depend on the geometry of the apparatus as well as gas velocity and composition.

The voltage may be applied in any one of several waveforms, including but not limited to Sine wave, square, triangle and pulsed voltages.

Other types of electrical discharge apparatuses that may be employed for breaking down methane include, but are not limited to, pulse, corona, and electron beam discharge and radio frequency, microwave, and ultraviolet light radiation sources.

The apparatus may further comprise an additional electron source configured to impinge free electrons on to the structure to induce stimulated electron field-emission therefrom. The additional electron source may be another nanostructure.

The apparatus may further comprise an electrical power supply connection operatively coupled to the nanostructure. The connection may be configured to provide a voltage pulse to the nanostructure.

The apparatus may further comprise a heating element arranged to heat the structure. The heating element may be arranged in thermal contact with a side of the substrate reverse to that on which the structure is present such that the heating element can conduct heat through the substrate to the structure.

The apparatus may further comprise a current controlled power supply configured to heat the substrate by ohmic heating. The current controlled power supply may be grounded by the cathode. The apparatus may further comprise a voltage controlled power supply configured to provide a voltage pulse to the connection. The voltage controlled power supply may be: electrically connected between the connection and the anode; and grounded by the cathode.

According to an ninth aspect, there is provided a method of scrubbing methane from a gas, the method comprising: establishing an electric field between a first electrode to which a dielectric portion is connected and a second electrode, a sub-macroscopic structure being connected to the first electrode, second electrode or dielectric portion, the electric field causing the structure to field emit electrons and electrical discharge to occur between the dielectric and the second electrode; and exposing gas to be scrubbed to the electrical discharge and electrons.

The method of the ninth aspect may incorporate any feature or combination of features of the apparatus of the eighth aspect.

The method may further comprise exposing the structure to a free electron to induce stimulated electron field-emission from the CNT. The free electron may be emitted from an additional electron source by field-emission or stimulated field-emission. The additional electron source may be another nanostructure.

The method may further comprise providing a voltage pulse to the structure. The pulse may have a magnitude lower than a breakdown voltage of said gas.

The structure may be arranged to generate said electron beam in an environment at an absolute pressure of no less than 80 kiloPascals (kPa).

The voltage pulse may have an absolute amplitude of from 100 volts (V) to 100 kV. The voltage pulse may have a duration of from 1 ns to 1 ms. The voltage pulse may be repeated periodically. The repetition could occur with a frequency of from 100 Hz to 500 kHz. The pulse repetition may form a pulse train with a duty cycle of less than 50%.

The method may further comprise heating the structure during the field-emission. The structure may be heated to between 20° C. and 500° C. Alternatively, the structure may be heated to between 100° C. and 400° C., such as to 150° C.

The method may further comprise: prior to exposing the gas to the electrons, mixing the gas with ammonia to form a gas mixture; and subsequent to exposing said gas mixture to the electrons, collecting a powder produced thereby.

According to a tenth aspect, there is provided a method of scrubbing methane in a gas with electrical discharge.

In the method of scrubbing methane in a gas, the electrical discharge may be barrier electrical discharge.

In the method of scrubbing methane in a gas, the electrical discharge may be dielectric barrier electrical discharge.

According to an eleventh aspect, there is provided a system for scrubbing methane in gas, the system comprising: an apparatus according to the seventh aspect or the eighth aspect, the apparatus comprising electrodes separated to allow a gas to be present between the electrodes in use; and a conduit connected to the apparatus and arranged in use to provide gas to the apparatus such that the gas passes between the electrodes, wherein an electric field is establishable between the electrodes, the electric field being configured to cause electrical discharge between the electrodes to which the gas is exposed in use. This allows the gas to be scrubbed to reduce the amount of methane present in the gas.

The system may further comprise an engine, wherein engine may be connected to the conduit, the conduit being arranged in use to pass gas from the engine to the apparatus. The engine may use LNG. Typically, the conduit may be connected to an exhaust outlet of the engine.

BRIEF DESCRIPTION OF FIGURES

Example apparatuses and methods are described in detail herein with reference to the accompanying drawings, in which:

FIG. 2Ai shows a horizontal cross-section of an example containing multiple versions of the arrangement shown in FIG. 2A.

DETAILED DESCRIPTION

Figure 1A:
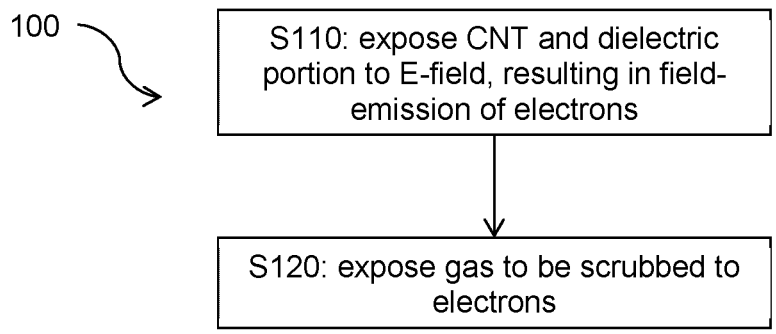
FIG. 1A is a flowchart of a scrubbing method.

We have developed a method to generate a large number of high-energy electrons, atoms and free radicals to remove pollutant molecules from gases. This is achieved using electrical discharge techniques that have been found to remove pollutant molecules, including but not limited to, particulate matter, SOx, NOx, mercury (Hg), volatile organic compounds (VOCs) and Hydrocarbons (HCs) from exhaust or flue gases.

As a general outline, an apparatus and method suitable for electron irradiation scrubbing of exhaust gas that contains methane (for example from an LNG engine) has been developed. A gas flow containing harmful/pollutant gas (such as methane) is introduced into the apparatus. The apparatus is provided with a plurality of electrodes (typically pairs of cathode and anode electrodes). The electrodes are separated by a gas space and a dielectric barrier.

Where anodes and cathodes are referred to herein, reference is made to two electrodes opposing one another across an air or gas gap with no other intervening electrodes, wherein the anode is defined as the electrode at the more positive potential of the two.

In various examples the apparatus includes a high-voltage, pulsed, power supply connected to the electrode pairs. This means that when gas passes between the electrode pairs, the gas is instantaneously ionized to form high-energy electrons, atoms and free radicals. When the gas flow is introduced from a gas inlet at an end of the apparatus passes through this discharge reaction zone (i.e. between an electrode pair), a portion of the methane present in the exhaust gas is converted to carbon monoxide (CO) and carbon dioxide ($CO_2$). This is achievable due to the electric field established between the electrodes.

Once purified, the gas flow is discharged through a gas outlet provided at an opposing end of the apparatus to the gas inlet. The composition of the flue gas after the apparatus is primarily $N_2CO_2H_2O$, $O_2$ a fraction of the original $CH_4$, and CO.

In using electrical discharge, high voltage alternating current is applied to electrodes that are typically separated by a gas space and a dielectric barrier or insulator. Other types of electrical discharge apparatuses include, but are not limited to, pulse, corona, and electron beam discharge and radio frequency, microwave, and ultraviolet light radiation sources. At least barrier electrical discharge and a number of the other named energy sources have not been used to reduce methane slip from an LNG engine of electric utilities and industrial plants before. That these forms of discharge are useful in these applications is surprising and unexpected.

Using a dielectric barrier allows sufficient energy to be provided to convert methane into the chemical species that will result in the formation of CO and $CO_2$. The dielectric material is applied over all the surface of either or both the cathode and anode. In various examples, the dielectric portion uses quartz as the dielectric material.

To augment the number of high-energy electrons produced from barrier discharge, materials that are efficient field-emitters of electrons are used in various examples. The process of field-emission involves the application of large electric fields to the surface of a material, whereby at sufficiently high electric field the vacuum barrier is reduced to the point that electrons can escape the surface of the material by quantum tunnelling. This is possible using the apparatus according to the examples due to the electric field provided to allow for the electrical discharge.

As an example efficient field-emitters, CNTs have been found to be very good field-emitters of electrons when exposed to an electric field. CNTs and other materials can produce large numbers of electrons at relatively low applied voltages because of their very high aspect ratio (typically 50 to 200 nm diameter versus 1 to 2 mm in length, i.e. 5,000 to 40,000 aspect ratio) and their low work function (typically around 4 eV). The high aspect ratio causes a large field enhancement at the tips of the CNTs with several V/μm achievable at low applied voltages. The minimum electric field strength required for field-emission from a CNT is generally around 30 V/μm. This can be achieved by varying one or more of the lengths of the CNT, the diameter of the CNT, the distance between the electrodes used to create the electric field, and the applied voltage. If an array of CNTs is used the density of the array can also be varied to vary the electric field strength since CNTs tend to shield one another.

A technique, which will be referred to herein as stimulated electron filed-emission, has been developed to further increase the numbers of electrons emitted by CNTs. This technique involves stimulation of the CNTs by energetic electron impact. This process is similar to the process of secondary electron emission in bulk materials where an energetic electron impinging on the surface causes a large quantity of bound electrons close to the surface (up to approximately 10 nm from the surface) to escape the material.

Stimulated electron field-emission is greatly enhanced in arrays of CNTs (gains up to 19,000 have been demonstrated), in part due to their large surface area and low density when compared with a bulk material such as a metal. An energetic electron travelling through a nanotube array travels a longer distance compared to an electron scattering through a bulk material due to the relatively low density of the array and the relatively large number of surfaces from which the electron can scatter. This deeper penetration leads to release of more electrons.

Electron field-emission and stimulated electron field-emission are very efficient processes in CNTs in vacuum, but become less efficient at higher pressures. For example, marine exhaust gases are typically at an absolute pressure of a little above atmospheric, e.g. 105 kPa, with fluctuations e.g. within a range of approximately 87 kPa to 140 kPa. This reduction in emission efficiency is perhaps due to the reduction of electric field caused by the high density of charged particles that forms in front of the free tips of the CNTs. A technique which can be used to maintain the instantaneous efficiency of electron production in nanotubes in high pressure environments (e.g. at around atmospheric pressure, for example 80 to 150 kPa) is to apply a series of voltage pulses to the CNTs.

In combination with the electrical discharge, it is proposed herein to use electrons emitted from one or more CNTs by field-emission to scrub gases such as flue emissions from combustion engines, e.g. in ships and other vehicles, power plants and incinerators. As such, according to some examples, one or more arrays of CNTs are provided for this purpose. In various example the apparatus is arranged, as described below, to cause emission of electrons from CNTs by field-emission and stimulated field-emission.

This catalyst-free scrubber technology can potentially reduce emissions of sulphur oxides by 99%, emissions of nitrogen oxides by 85%, and emissions of methane by 90% from the exhaust of new and retrofitted ship engines fuelled, for example, with LNG. This technology can also reduce other pollutants (as yet unregulated in the shipping industry) such as hydrogen chloride, hydrogen fluoride, volatile organic compounds and dioxins.

FIG. 1A is a flowchart of an example scrubbing method 100. At S110, a CNT and a dielectric portion are exposed to an electric field, resulting in the field-emission of electrons from the CNT and electric discharge between the dielectric and opposing electrode. At S120, gas to be scrubbed is exposed to those electrons.

Figure 1B:
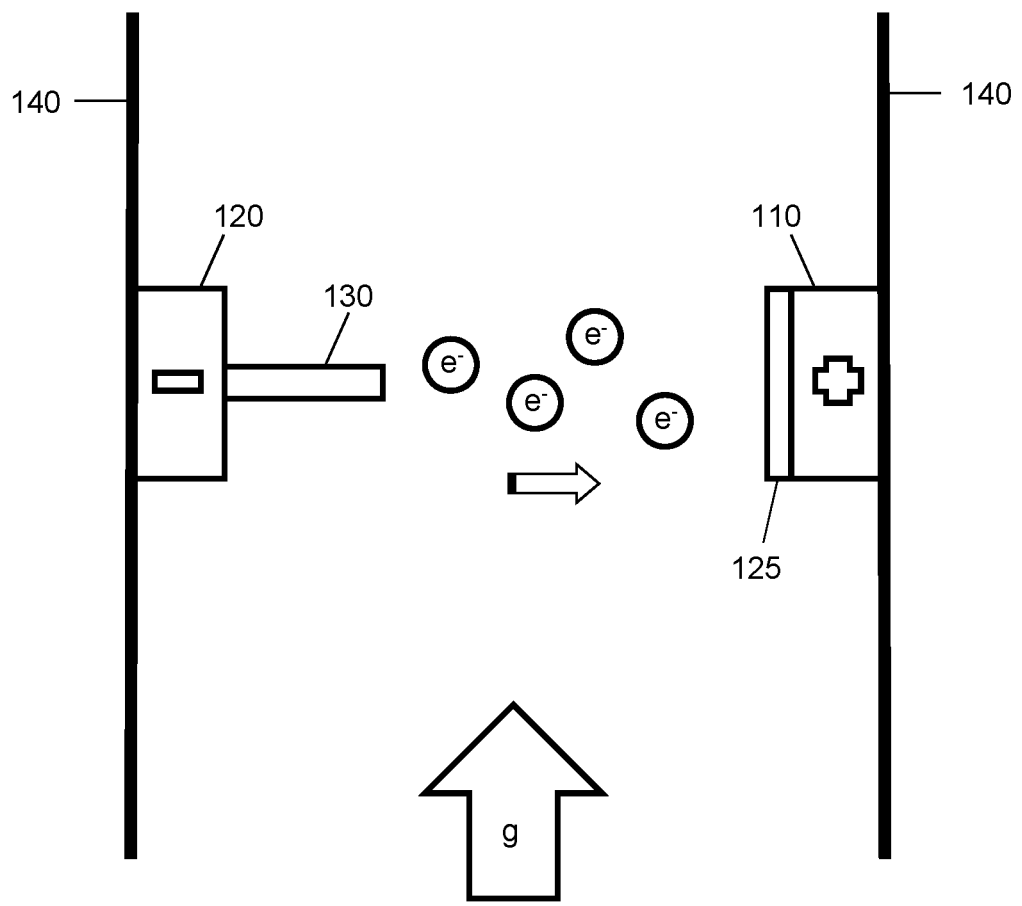
FIG. 1B schematically illustrates the principle of an electron irradiation and electrical discharge scrubbing technology.

FIG. 1B schematically illustrates the principle of this electron irradiation and electrical discharge scrubbing technology. Two electrodes, an anode 110 and a cathode 120, are located so that they facing each other. In this example, a dielectric portion 125 is located on the anode. This dielectric portion provides a coating on the entire surface of the anode.

The example in FIG. 1B also includes a CNT 130 located between the anode 110 and the cathode 120. In this example, the CNT is electrically connected to the cathode.

The CNT 130 field-emits electrons (e−, e−) in response to the presence of an electric field between the anode 110 and cathode 120 when a potential difference is established between them. The electric field between the anode and cathode also causes electrical discharge (in the form of dielectric barrier electrical discharge) between the dielectric portion 125 and cathode 120.

The electrodes are coupled to a housing in order to locate the dielectric portion 125 and CNT 130 in the vicinity of a container 140 containing gas (g) to be scrubbed such that an interior of the container can be exposed to the field-emitted electrons and electrical discharge.

Using the example in FIG. 1B, methane in the gas in the container 140 is able to be reduced. The major chemical reaction in the conversion of the methane into carbon monoxide and carbon dioxide are as follows:

 (1)

 (2)

 (3)

 (4)

 (5)

 (6)

 (7)

 (8)

 (9)

$$H_2CO + OH^- \rightarrow HCO^- + H_2O \quad (10)$$

$$HCO^- + O_2 \rightarrow CO + HO_2^- \quad (11)$$

$$CO + OH^- \rightarrow HCO_2^- \quad (12)$$

$$HCO_2^- + O_2 \rightarrow CO_2 + HO_2^- \quad (13)$$

The notation "+" indicates the relevant molecule has a positive charge, the notation "−" indicates the relevant entity has a negative charge, the notation "*" indicates the relevant molecule is at an excited state, and the notation "·" indicates the relevant molecule has a free radical. The notation "hν" is intended to indicate energy (specifically, the notation represents the product of Planck's constant, h, and frequency, Greek letter nu, ν), which in this example is achieved by the gas interacting with the electrical discharge. To initiate this process, typically a minimum of about 4 eV/molecule of methane is generally required.

For a compact arrangement, the anode 110 and/or cathode 120 can be attached to the interior of the container (such as a chimney) such that each of the dielectric portion 125, CNT 130 and a surface of the cathode extends into the chimney and the electrical discharge and electrons traverse a cross-section of it. Many other arrangements could be envisaged however. For example, the dielectric portion and/or CNT and surface of the cathode could be located outside of, but close to, the container with a window (aperture) in the container side permitting electron access and a surface at which the electrical discharge is able to initiate/terminate. Such an arrangement may for example be chosen to make retrofitting of the apparatus to an existing chimney easier, or for ease of maintenance of the dielectric portion and/or CNT part of the apparatus. The cathode and housing need not be co-located.

The field-emission rate of the CNT 130 can be improved by pulsing the voltage applied between the anode and cathode and/or by stimulating the CNT with energetic electron/ion bombardment.

Figure 2:
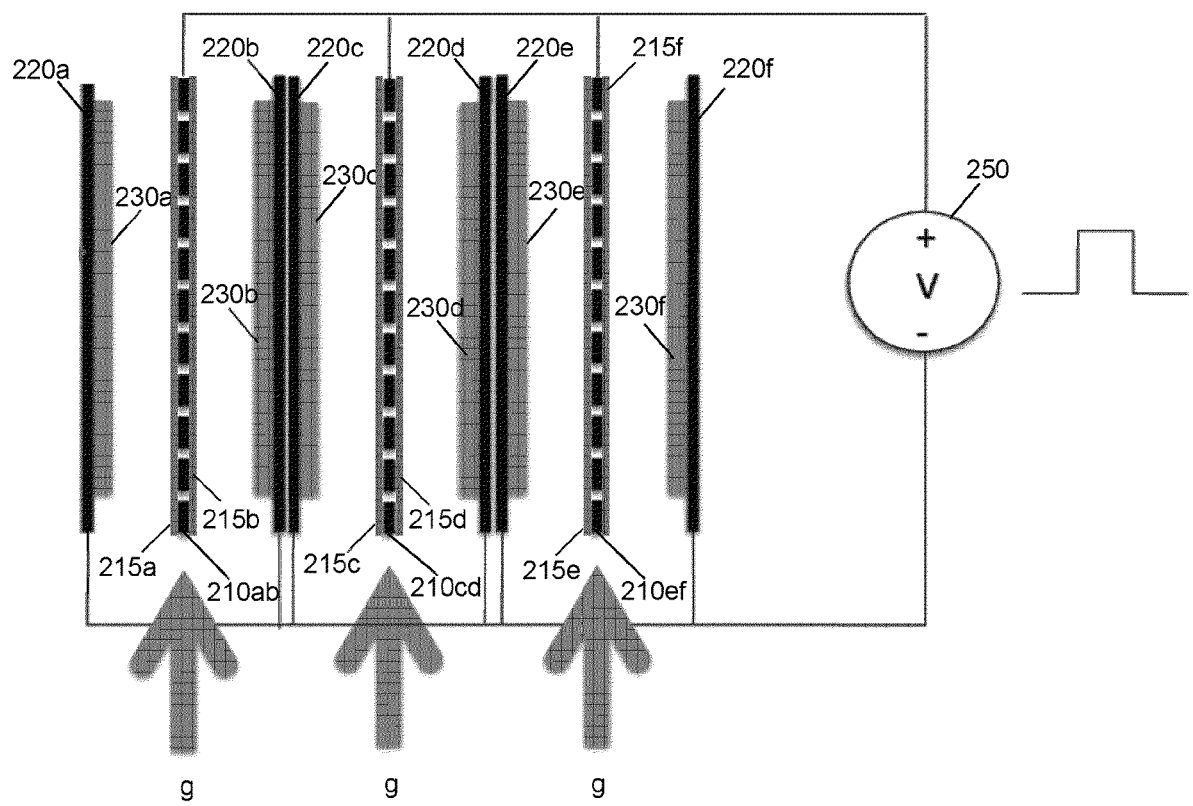
FIG. 2 schematically illustrates an example larger scale arrangement shown in vertical cross-section.

It may be more practical, such as in an industrial setting, to use arrays of CNTs rather than individual CNTs. It may also be beneficial to provide multiple sets of anode-dielectric-cathode-CNT apparatuses. FIG. 2 illustrates such a larger scale arrangement shown in cross-section through a chimney. Arrangements could also be envisaged wherein multiple sets of anode-dielectric-cathode-single CNTs are used, or in which there is a single set of anode-dielectric-cathode-CNT array. FIG. 2 shows six CNT arrays as an illustrative example. In other examples, other numbers of arrays are used.

In FIG. 2, arrays 230 of CNTs are provided on conductive substrates 220, which act as cathodes opposed to anodes 210. The anodes are all electrically connected to the positive terminal of an electrical supply 250, while the cathodes are electrically connected to its negative terminal. The anodes are also coated with dielectric portions 215.

Flue gas (g) rises up between the anodes 210 and cathodes 220 and is thus exposed to electrical discharge between the dielectric portions 215 and cathodes 220 and electrons field-emitted by the CNT arrays 230. The separation of each CNT array from its corresponding dielectric portion could for example be approximately 0.5 to 1 cm.

The rate of electron emission from the CNT arrays 230 can be increased if electrical supply 250 is a voltage controlled supply operated to send a voltage pulse to the cathodes, with the cathodes being electrically connected to the CNTs. Such a voltage pulse could suitably have an absolute amplitude of from 100 V to 100 kV, for example 30 kV works well for gas mixtures up to about one atmosphere absolute pressure. The pulse voltage should be below the breakdown voltage for the gas mixture (the voltage necessary to cause electric arc independent of the electrical discharge able to be established due to the dielectric portions 215). This maximum voltage can be calculated using Paschen's Law for the specific gas mixture and pressure. The pulse could have a duration of from 1 ns to 1 ms, for example 200 μs. A series of voltage pulses could be employed. A periodic voltage pulse train could be used, for example with a frequency of from 100 Hz to 500 kHz, e.g. 1 kHz. Suitably, a duty cycle of less than 50% can be employed. Optimal pulse parameters depend on the geometry of the apparatus as well as gas velocity and composition.

Figure 2A:
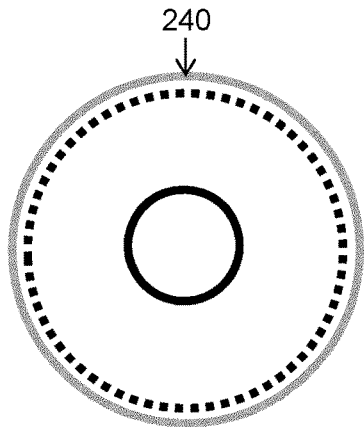
FIG. 2A shows a horizontal cross-section of an example arrangement according to FIG. 2.
Figure 2B:
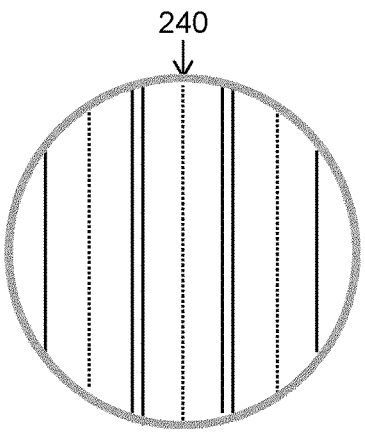
FIG. 2B shows a horizontal cross-section of another example arrangement according to FIG. 2.

As mentioned above, FIG. 2 shows a cross-section through a chimney. This can correspond to two arrangements of anodes and cathodes as shown in FIGS. 2A and 2B, which respectively show horizontal cross-sections of the two arrangements as implemented in chimneys of circular cross-section. A similar apparatus could be used in chimneys having cross-sections of other shapes, for example square or rectangular. Apart from where otherwise indicated with reference numerals, in FIGS. 2A and 2B dotted lines indicate anodes and solid (i.e. non-dashed or full) lines indicate cathode-array arrangements.

According to the example shown in FIG. 2A, within chimney 240 are concentrically arranged (from outside to inside) an anode and a central cathode.

According to the arrangement of FIG. 2B, within chimney 240 are arranged substantially flat plate (from left to right) cathode, anode, back-to-back cathode pair, anode, back-to-back cathode pair, anode, cathode. The plates could be of varying widths so as to extend all the way across the chimney as shown. This maximises the volume of gas passing between plates. Alternatively, the plates could all be substantially the same width for ease of manufacture.

Figure 2C:
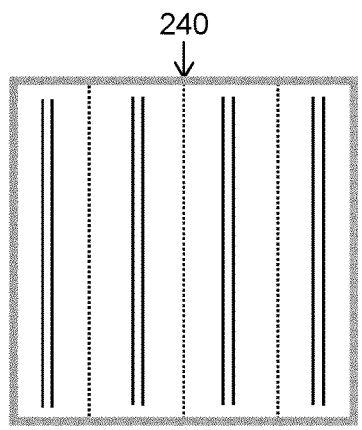
FIG. 2C shows a horizontal cross-section of an alternative example arrangement.
Figure 2A:
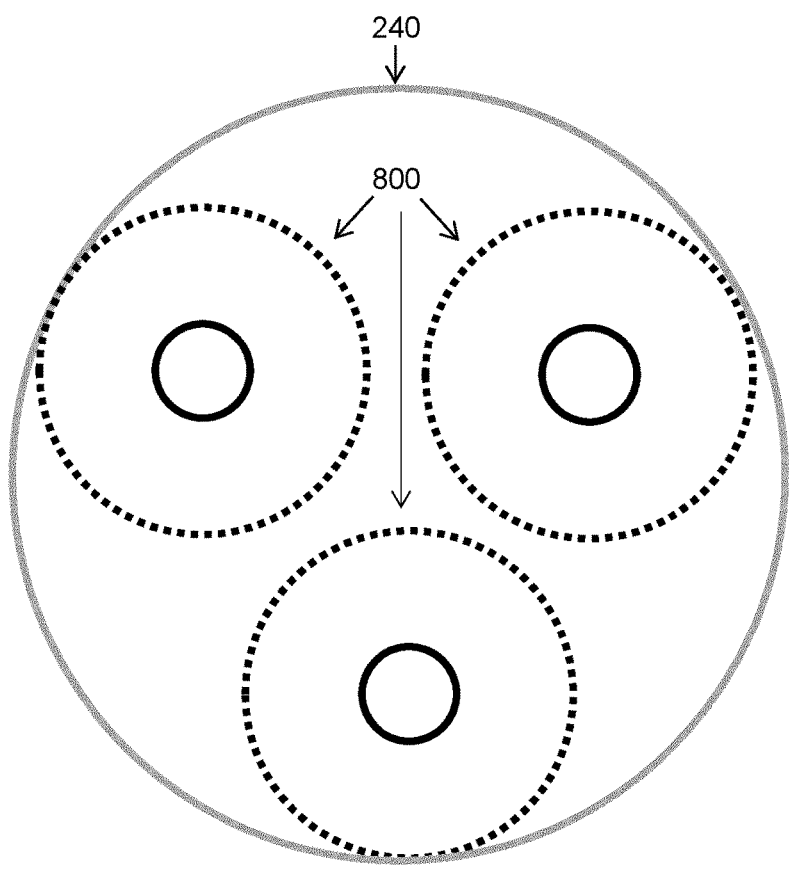

A slightly different arrangement is shown in FIG. 2C. In this case, the container wall is conductive (such as due to being metallic) and acts as an anode. For instance, container wall could be in electrical contact with the anodes indicated by dotted lines. From left to right the electrodes are thus container wall anode, back-to-back cathode pair, anode, back-to-back cathode pair, anode, back-to-back cathode pair, anode, back-to-back cathode pair, container wall anode. The container walls, and optionally the other anodes, could all be grounded, with the cathodes held at a negative potential. A container of square cross-section is shown in this case, but the principle of using the container walls as electrodes could apply to other cross-section shapes.

Scaling the kinds of arrangements shown in FIGS. 2 to 2C up to sizes typical for a ship exhaust, a 1 square metre (m$^2$) cross-section chimney could for example have CNT array pairs repeated across the cross-section at a pitch of approximately 2 centimetres (cm). The number of arrays needed would thus be of the order 100. In each case, each of the anodes of course have dielectric portions thereon.

The arrangements shown in FIGS. 2 and 2B all involve back-to-back cathode pairs. As shown in FIG. 2, each cathode of a pair could have a separate electrical connection to the voltage supply 250. A single electrical connection can be used to each pair if the cathodes of each pair are electrically connected to one another. Alternatively, in place of each back-to-back cathode pair a single cathode could be used with a CNT array located on both sides of it.

The anodes could be metallic meshes. When the anodes are metallic meshes, the dielectric portion is coated on to the mesh so as to maintain the mesh structure. In other words, the dielectric coating is provided with apertures that align with apertures in the mesh.

If each anode is provided by a mesh, some electrons field-emitted by the leftmost array 230a as illustrated in FIG. 2 can pass through the anode 210ab and go on to cause stimulated field-emission in the next array 230b. This effect is enhanced if the potentials of the cathodes are stepped, i.e. (using the example shown in FIG. 2) the leftmost cathode 220a is at the lowest potential, the next cathode 220b is at a slightly higher potential (but still lower than the leftmost anode 210ab). Such potential stepping could be achieved using placement of appropriately rated resistors between electrodes (not shown).

Although in this example the second cathode 220b is at a higher potential than the leftmost cathode 220a, the second cathode 220b is still referred to as a cathode not an anode since the anode 210ab, at a higher potential than both cathodes 220a and 220b, separates the two cathodes. This is consistent with the above statement that where anodes and cathodes are referred to herein, reference is made to two electrodes opposing one another across an air/gas gap with no other intervening electrodes, wherein the anode is defined as the electrode at the more positive potential of the two.

As an example, the leftmost cathode 220a could be at −1.3 kV relative to the leftmost anode 210ab, which is grounded (e.g. at 0.0V), and the next cathode 220b could be at −1.0 kV. An electron coming from the leftmost cathode 220a will have 1.3 keV of energy at the anode mesh 210ab and it only needs 1 keV to reach the next cathode 220b. When it hits that cathode 220b it can generate up to 19,000 electrons. This stepped pattern could be repeated across the three cathode-anode-cathode cells of the arrangement.

In some examples, such as the example shown in FIG. 2, the cathode(s) and anode(s) are flat plates that face one another with a dielectric material between them (such as coated on each anode). In those examples, the plates are able to be mounted in an upright (such as vertical) position to prevent plugging with particulate matter. The rows of plates are supported by a mechanical structure and suspended by insulators from the top of the casing so that the plane of the plates is able to be parallel to the flow direction of the flue gas within a casing in which the plates are located. In this manner, a maximum amount of the flue gas is treated by the electrical discharge with a minimum pressure drop across the apparatus. In some examples, a plurality of rows of plates are mechanically fastened together, one on top of the other, to form a stack that reaches substantially from the top to the bottom of the casing.

Although flat plate cathode and anode configuration may be a preferred arrangement in some examples, different arrangements are also possible. Such arrangements include cylindrical cathode electrodes and flat plate anode electrodes, and cylindrical cathode electrodes centred in the middle of cylindrical anode electrodes. In these example arrangements, the cathode electrodes and anode electrodes may have identical construction (with, for example, one set of electrodes having one or more sub-macroscopic structures thereon and the other set of electrodes having dielectric portions thereon), and differ only in that one is wired to the power supply and the other is wired to ground. In those examples, in operation, the high voltage and ground electrodes would alternate along an entire row, and have ground electrodes at the end. This allows a high voltage gradient to exist between the electrodes.

In some examples, a coaxial tube-style reactor arrangement is used, such in the arrangement shown in FIG. 2A. In examples using a coaxial tube-style reactor arrangement one electrode is provided by a conductive tube, a centre electrode is secured inside along the central longitudinal axis of the conductive tube, and a dielectric material is disposed between them within the tube. In various examples, the tubes are arranged in tube bundles, such as shown in FIG. 2Ai.

FIG. 2Ai shows a chimney 240 in which a bundle of tubes 800 are arranged, each bundle having an arrangement of electrodes corresponding to the arrangement shown in FIG. 2A, namely an anode coaxially arranged around a central cathode.

When there are multiple tubes or tube bundles, the actual number of bundles stacked on top of each other and side by side are engineering decisions made dependent on the requirements of the system for which apparatus is to be used. In such examples a plurality of coaxial electrode tubes are secured in a spaced relationship to each other typically using a rectangular structure. Various examples include wire electrodes secured inside the coaxial electrodes along the central longitudinal axes of the tubes. Although the term "wire" is used, these electrodes may instead be rods, or other shaped material smaller than the inside diameter of the tubes.

Coaxial reactors have improved performance of dielectric barrier electrical discharge over flat plate electrodes. This is because it is typically easier to establish a barrier discharge within the whole discharge area in a coaxial reactor than flat plate reactor. Additionally, temperature gradients between the top and bottom of a flat plate reactor often provide inhomogeneous reactions, which decrease reactor efficiency. This is because in flat plate reactors the discharge causes the top of a plate is hotter than the bottoms and the middle is hotter than the sides. Coaxial reactors, on the other hand, tend to "light off" (i.e. generate discharge) more evenly throughout the whole tube as soon as temperature and power requirements reach the threshold for the particular reactor geometry. This makes the reaction more homogenous. The result of this is that more gas is exposed to the barrier discharge, meaning more gas is treated.

As mentioned above, FIG. 2 shows an example that uses meshed anodes. An alternative to using meshed anodes is a stepped potential arrangement such as that shown in FIG. 3 could be used. The CNT arrays are arranged in a double zigzag configuration with each array being located on a substrate forming an electrode at a slightly higher potential than the last. This is achieved by the electrodes being connected in series, alternating with resistors. Array 330A field-emits electrons, some of which impinge on array 330B. Array 330B consequently emits electrons by stimulated field-emission, some of which impinge on array 330C and so on in alphabetical order all the way to array 330G as indicated by the arrows. Some of the electrons emitted by each array will likely also impinge on other arrays than just the one with the next highest potential; the path taken by each free electron will depend on the electric field it travels through, generated by a combination of all the electrodes.

Figure 3:
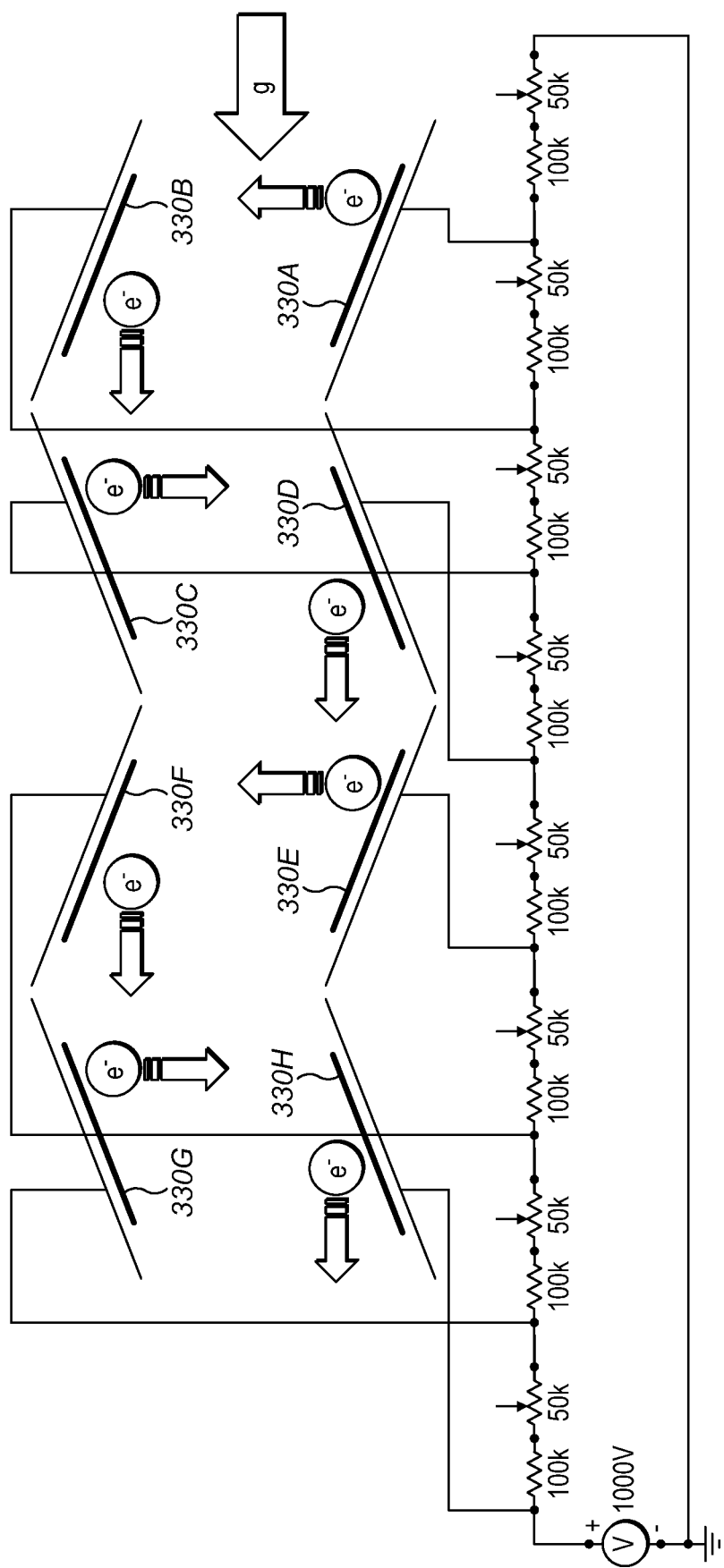
FIG. 3 schematically illustrates an example stepped potential arrangement.

In the arrangement shown in FIG. 3, there are examples where every electrode is coated with a dielectric portion. In such examples, the CNT arrays may be located on the respective dielectric portions. In other examples using the arrangement of FIG. 3, every other electrode, such as the electrodes on which CNT arrays 330B, 330D, 330F and 330H are located, is coated with a dielectric portion. In these examples, on the electrodes coated with a dielectric portion the CNT arrays may be located on the respective dielectric portions. The various examples that include dielectric portions allow electrical discharge to pass between the electrodes while also allowing field emission from the CNT arrays.

Before passing through the apparatus, the gas may be pre-treated. For example, the gas may pass through an electrostatic precipitator to remove particulate material. The gas may also be cooled, for example using a heat exchanger or by spraying or atomising cold water or another liquid or solution through it.

If ammonia is added to the gas before the gas passes between the electrodes, breakup of any sulphur oxides or nitrogen oxides as a result of the electron irradiation leads to the formation of ammonium sulphate and ammonium nitrate salts respectively. These salts can be used in fertilisers. An efficient way to collect these salts is to pass the irradiated gas through a wet precipitator, resulting in precipitation of a solution of ammonium sulphate nitrate, which is then used as the cooling spray for pre-treatment of the flue gas. The heat of the flue gas evaporates the water out of the salt solution, leaving the solid salts to drop into a particulate collector. Only a little water may need to be added to make up for stack losses; the rest is continuously recycled through a spray dryer-precipitator loop.

Figure 4A:
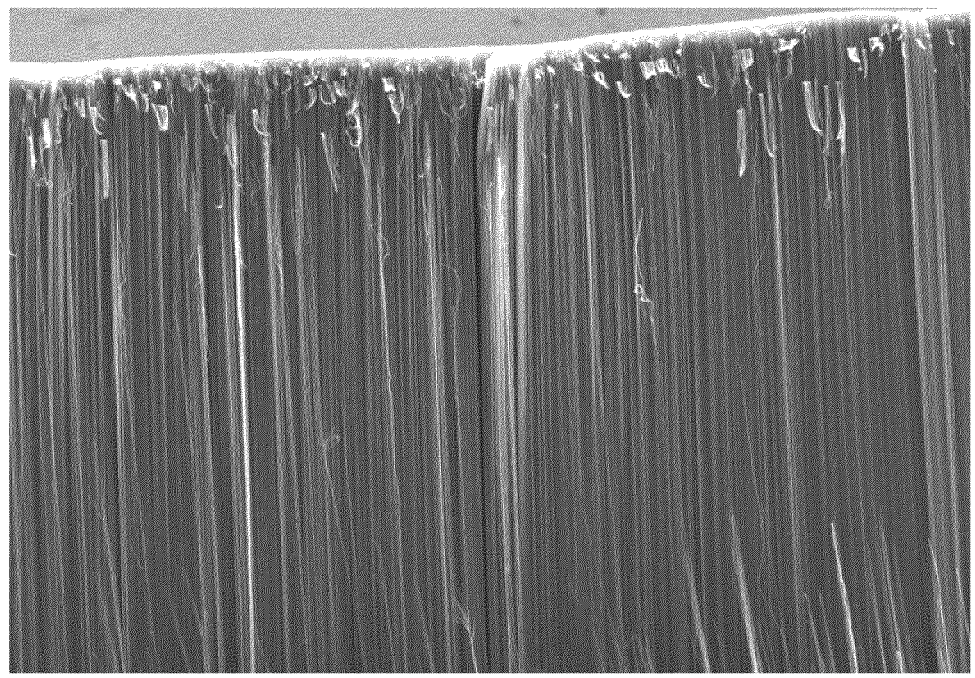
FIG. 4A is a side-view of a CNT array taken with a scanning electron microscope.
Figure 4B:
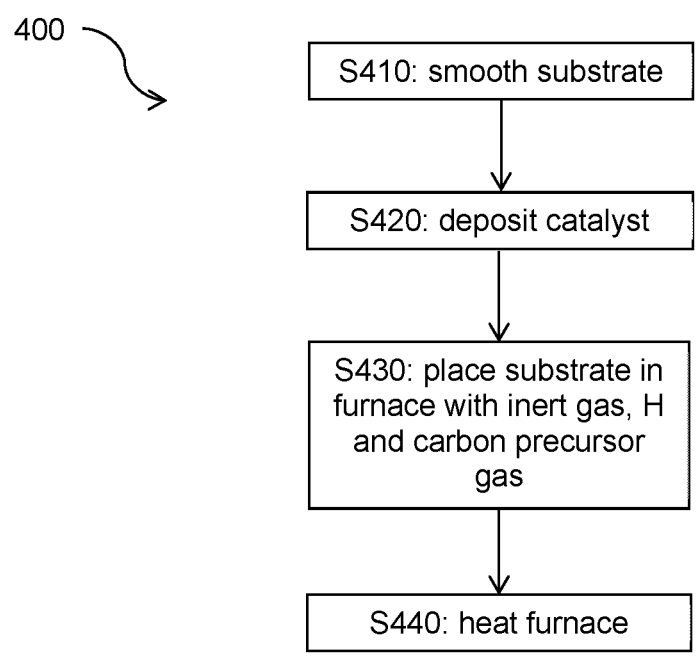
FIG. 4B is a flowchart of an example CNT array fabrication method.

FIG. 4A is a side-view of a CNT array taken with a scanning electron microscope. The length of each CNT is approximately 2 mm. Such an array can be fabricated in a number of ways. A flowchart of one example method 400 is provided as FIG. 4B.

At S410 a substrate material is pre-processed to achieve sub-nanometre surface smoothness. For example, if silicon is used as a substrate, an aluminium buffer layer can be deposited on its surface. Such a buffer layer could be approximately 10 nm thick. Alternatively, if a metal substrate is used (e.g. titanium, aluminium, copper or alloys thereof), step S410 could comprise polishing the surface of the metal. This polishing could for example involve an electrolytic process. The substrate could for example be approximately 0.5 mm thick.

At S420 a catalyst is deposited on the substrate. The catalyst layer could be e.g. approximately 1 nm thick. The catalyst could for example be iron, nickel or cobalt. The catalyst could be deposited according to a predetermined pattern, e.g. using photolithography. Features of the pattern, for example, the pitch and/or geometry of a grid, could depend on the makeup of the gas the array will be used to scrub. Suitably, the pitch of the pattern (which determines the spacing of the CNTs in the array) could be less than or equal to the mean free path of the gas, which could typically be up to around 400 nm.

At S430 the prepared substrate is placed in a furnace with a mixture of an inert gas, hydrogen and a carbon precursor gas (e.g. $C_2H_2$, $C_2H_4$, $CH_4$ or $C_4H_{10}$). For example, the furnace gases could consist of 600 sccm (standard cubic centimetres per minute) argon, 75 sccm ethylene and 600 sccm hydrogen.

At S440 the furnace is heated, resulting in decomposition of the precursor gas. Nucleation occurs on the catalyst to form nanoparticles from which the CNTs grow. The furnace could for example be heated to around 650 to 800° C.

The CNTs can be coated, either entirely or partially, e.g. on their free ends, with a low work function coating, for example caesium or hafnium, to improve the field-emission rate.

Alternatively or additionally, the CNTs could be doped with an electron transport enhancing or electrical conductivity enhancing material to improve the field emission efficiency. For example, doping with nitrogen causes metallic behaviour in semiconducting CNTs.

Fabrication of CNTs typically results in the production of a mixture of single walled CNTs (SWNTs), which tend to come in a mixture of metallic and semiconducting types, and multi walled CNTs (MWNTs). Since MWNTs and metallic SWNTs are better electrical conductors than semiconducting SWNTs, a fabrication process which favours a high percentage of either or both of the former types of CNTs relative to the latter is preferable.

Field-emission in semiconducting SWNTs follows the same physical process as metallic SWNTs but electrical conduction through the nanotube is not as efficient which can lead to charging and increase in the vacuum (or surface) barrier, reducing the field-emission efficiency. It may be possible however to improve the efficiency by further exciting the system by for example using a higher applied voltage and/or shining a laser on the CNTs.

CNT arrays can become clogged with dust when left exposed. If the arrays are in direct contact with flue gases as illustrated they can also become clogged with any small particulates which are not successfully removed by the gas preconditioning. If ammonia is added as described above then ammonium sulphate nitrate salt particles can also coat the array surfaces (the particles being generally too large to penetrate the arrays to clog them). CNTs can also be damaged by discharges and shorts, which can occur during operation due to ionisation of the gas. Damage to the CNTs can also occur due to collisions with accelerated ions. For all of these reasons, the field-emission performance of CNT arrays in high pressure environments (for example at around atmospheric pressure, for example 80 to 150 kPa) tends to decrease over time. All of these problems, which were not encountered for previous CNT emission systems with the CNTs in (near) vacuum, can be solved by heating the arrays, for example to around 600 to 800° C. for 1 to 3 hours in an inert gas. This anneals the CNTs, repairing broken bonds and recovering the original shape. Surface dust burns off and any adsorbed gases are desorbed.

In various examples the arrays are heated during use to further effect continuous annealing and to reduce the sticking coefficient to limit particulate deposits. In some examples, such heating is performed by a heating element affixed to the back of the array substrate. In alternative examples, ohmic heating of the substrate itself is employed.

Figure 5:
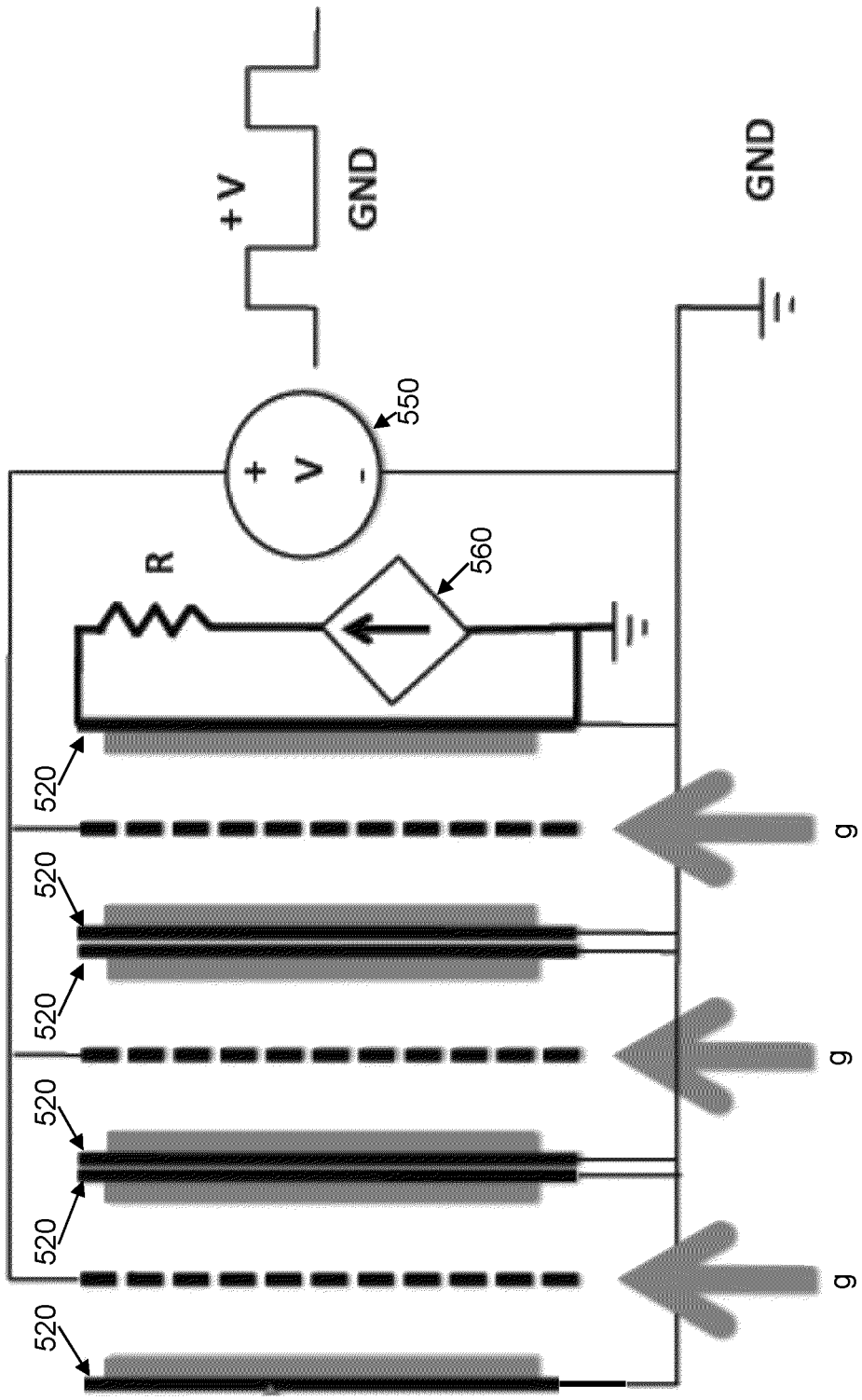
FIG. 5 schematically illustrates an example ohmic heating arrangement.

An example ohmic heating arrangement is schematically illustrated in FIG. 5. A current controlled power supply 560 is used to heat the substrates 520. The current controlled power supply and the voltage controlled power supply 550 could both be grounded through the substrates (cathodes).

If a low work function coating is employed, then a coating having a high melting point is preferred. For example, coatings having melting points above 400° C. would be suitable, e.g. coatings comprising hafnium, which has a melting point of 2231° C. This allows for CNT self-repair by heating as described above, and also ensures the coating remains intact even when exposed to hot exhaust gases.

In the various examples set out herein, the apparatus can be maintained at temperatures between 20° C. and 400° C., typically at about 150° C.

In the example shown in FIG. 5, the anodes are shown as meshes corresponding to the mesh anodes shown in the example of FIG. 2. As with the example shown in FIG. 2, the anodes in the example shown in FIG. 5 are each coated with a dielectric portion.

A system combining bare CNTs, and/or CNTs with a low work function coating, and/or CNTs with a catalytic coating could be used to achieve optimal performance. Example catalytic coating materials include vanadium oxide ($V_2O_5$), zinc oxide (ZnO), manganese oxide ($MnO_2$) and tungsten trioxide ($WO_3$). These materials can for example be coated directly onto the CNTs, or over a titanium dioxide ($TiO_2$) coating. Titanium dioxide is known to provide strong mechanical support and thermal stability to the catalysts. Other combinations of such catalysts could also be used. For example $V_2O_5$—$WO_3$/$TiO_2$. To implement this $TiO_2$ could first be evaporated onto the nanotubes and then $V_2O_5$ and $WO_3$ could be deposited.

The nanotubes could be filled fully or partially with a stiffening material to make them stiffer and/or so that they bond more strongly to the substrate surface. This makes them more resistant to damage. For example, a transition metal filler such as titanium, iron or copper could be used. Suitably, the filling material can be the substrate material and/or a combination of the substrate material and carbon (e.g. a carbide of the substrate material). Nanotubes bonded to a titanium substrate could be filled with titanium carbide to produce very well bonded nanotubes.

As an alternative to CNTs, or additionally for the same purpose, other types of sub-macroscopic structures, such as nanostructures or microstructures, that field-emit electrons could be used, such as carbon nanohorns, silicon nanowires, titanium dioxide nanotubes or titanium dioxide nanowires. High aspect ratio nanostructures provide for more efficient field emission, for example nanostructures having an aspect ratio of at least 1,000 could be used. An advantage of using nanowires is that large arrays of vertically aligned nanowires can be easily manufactured on an industrial scale. These examples do not field-emit as efficiently as CNTs, but their field-emission could be improved by coating with low work function materials as described above. Alternatively or additionally, the field emission could be made more efficient by doping with electron transport enhancing or electrical conductivity enhancing materials. For example, Group III (acceptor) or Group V (donor) atoms (e.g. phosphorous or boron) could be used in silicon nanostructures.

If titanium dioxide is used, either to form the nanostructures or to coat them, the temperature of the nanostructures (whether as a result of exposure to hot exhaust gas or deliberate heating for self-repair as described above) should be kept below 600° C. Above this temperature titanium dioxide changes from an anatase structure to a rutile structure.

Figure 6:
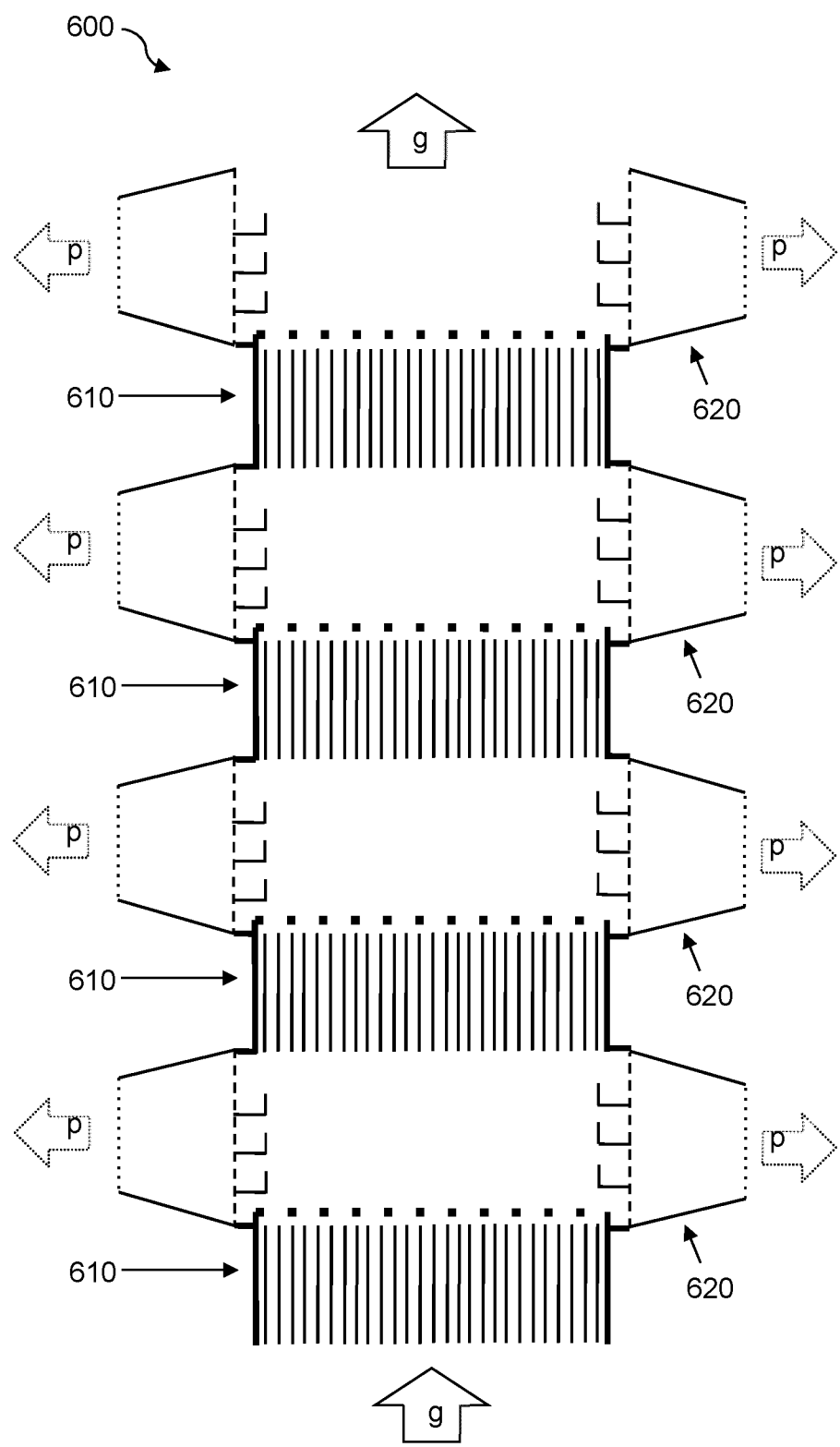
FIG. 6 illustrates an example scrubbing apparatus.

FIG. 6 schematically illustrates an example arrangement 600 of the type of apparatus described above in a chimney. Stacks of CNT arrays 610 alternate with particle precipitator/collectors 620 along the path of the gas flow g. There could for example be four CNT array stacks alternating with four particle precipitator/collectors. Particles p are directed out of the chimney towards hoppers. In examples using this arrangement, dielectric portions are coated on electrodes to allow electrical discharge to occur.

The CNT arrays could for example be formed on plates 1 m wide and 0.2 m high. They could be vertically separated by e.g. 0.3 m. In the quad-module example shown in FIG. 6, the total height of the apparatus 600 would therefore be 2 m. Each CNT array stack 610 could for example comprise 50 CNT array pairs, for example arranged as shown in FIG. 2C with 49 back to back pairs, plus a single array at each of the left and right edges.

Where this application has listed the steps of a method or procedure in a specific order, it could be possible, or even expedient in certain circumstances, to change the order in which some steps are performed, and it is intended that the particular steps of the method or procedure claims set forth herein not be construed as being order-specific unless such order specificity is expressly stated in the claim. That is, the operations/steps may be performed in any order, unless otherwise specified, and embodiments may include additional or fewer operations/steps than those disclosed herein. It is further contemplated that executing or performing a particular operation/step before, contemporaneously with, or after another operation is in accordance with the described embodiments.

The invention claimed is:

1. A system for scrubbing methane in gas, the system comprising:
    a dielectric barrier electrical discharge apparatus, comprising at least two electrodes arranged in use to provide at least one anode and at least one cathode, an electric field thereby being establishable therebetween, the at least two electrodes being separated to allow a fluid to be present between the electrodes in use, wherein at least one of the electrodes has a dielectric portion connected to at least part of said electrode, and a sub-macroscopic structure being connected to one of the at least two electrodes or to the dielectric portion, wherein in response to the presence of the electric field between the electrodes, the sub-macroscopic structure is arranged to field-emit electrons and electrical discharge is establishable between the dielectric portion and one of the at least two electrodes, and wherein the electrodes are separated to allow a gas to be present between the electrodes in use;
    a conduit connected to the apparatus and arranged in use to provide gas to the apparatus such that the gas passes between the electrodes, wherein an electric field is establishable between the electrodes, the electric field being configured to cause electrical discharge between the electrodes to which the gas is exposed in use; and
    an engine, wherein the engine is connected to the conduit, the conduit being arranged in use to pass gas from the engine to the apparatus, and wherein the engine uses gas fuel.

2. The system according to claim 1, wherein the sub-macroscopic structure is electrically connected to at least one of the electrodes.

3. The system according to claim 2, wherein each electrode to which the sub-macroscopic structure is electrically connected is arranged in use to provide the at least one cathode.

4. The system according to claim 1, wherein the apparatus is for scrubbing methane in waste gases and the at least two electrodes comprise a first electrode and a second electrode, the first and second electrodes being arranged in use to provide the at least one anode and the at least one cathode, the dielectric portion being connected to the first electrode and the sub-macroscopic structure being connected to the first or second electrode or to the dielectric portion, the apparatus further comprising:
    a housing coupled to the electrodes, the electrodes being located on the housing so that the sub-macroscopic structure and the dielectric portion each extend into a container containing gas to be scrubbed such that an interior of said container can be exposed to said electrons and electrical discharge.

5. The system according to claim 4, wherein the first electrode is arranged in use to provide the anode.

6. The system according to claim 4, wherein the second electrode is arranged in use to provide the cathode.

7. The system according to claim 4, wherein the sub-macroscopic structure is electrically connected to one of the electrodes.

8. The system according to claim 4, wherein the sub-macroscopic structure is electrically connected to the second electrode.

9. The system according to claim 1, wherein the dielectric portion is a coating on at least part of a surface of the or each electrode to which the dielectric portion is connected.

10. The system according to claim 1, wherein the sub-macroscopic structure is a nanostructure, and the nanostructure has an aspect ratio of length to width of at least 1,000.

11. The system according to claim 1, wherein the electrodes are arranged to be between 20 degrees Celsius (° C.) and 500° C.

12. The system according to claim 1, further comprising a power supply connected to at least one of the electrodes, the power supply being arranged in use to provide a voltage pulse to at least one of the electrodes.

13. The system according to claim 12, wherein the power supply is arranged in use to provide a voltage pulse having at least one of the following:

a duration between 1 nanosecond (ns) and 1 millisecond (ms); and a repeat periodicity of between 100 Hertz (Hz) and 500 kHz, the pulse repetition preferably forming a pulse train with a duty cycle of less than 50%.

14. The system according to claim 1, wherein the gas fuel is liquefied natural gas (LNG).

15. The system according to claim 1, wherein the conduit is connected to an exhaust outlet of the engine.

16. A method of scrubbing methane from a gas using the system according to claim 1, the method comprising:

establishing an electric field between a first electrode to which a dielectric portion is connected and a second electrode, a sub-macroscopic structure being connected to the first electrode, second electrode or dielectric portion, the electric field causing the sub-macroscopic structure to field emit electrons and electrical discharge to occur between the dielectric and the second electrode; and exposing gas to be scrubbed to the electrical discharge and electrons.

* * * * *